United States Patent [19]

George et al.

[11] Patent Number: 5,216,374
[45] Date of Patent: Jun. 1, 1993

[54] FREQUENCY SYNTHESIZER UTILIZING PULSE-WIDTH MODULATION OF DIGITAL VCO CONTROL SIGNAL

[75] Inventors: Ashok K. George, San Diego; Branislav Petrovic, La Jolla, both of Calif.

[73] Assignee: General Instrument Corporation, Chicago, Ill.

[21] Appl. No.: 725,582

[22] Filed: Jul. 3, 1991

[51] Int. Cl.⁵ .................. H03B 19/00; H03L 7/00
[52] U.S. Cl. ........................................ 328/14; 331/25
[58] Field of Search .................. 331/25, 27, 1 A; 328/14

[56] References Cited

U.S. PATENT DOCUMENTS

| Re. 32,686 | 5/1988 | Dages | 455/182 |
| 4,298,988 | 11/1981 | Dages | 455/182 |
| 4,686,488 | 8/1987 | Attenborough | 331/25 |
| 4,823,399 | 4/1989 | George | 455/192 |
| 5,045,813 | 9/1991 | Yamashita et al. | 331/25 |
| 5,053,723 | 10/1991 | Schemmel | 331/25 |

Primary Examiner—William L. Sikes
Assistant Examiner—Sinh Tran
Attorney, Agent, or Firm—Edward W. Callan

[57] ABSTRACT

A frequency synthesizer includes a voltage-controlled oscillator (VCO) for producing a VCO output signal within a given frequency range, wherein the VCO produces the VCO output signal at a predetermined frequency in response to an analog VCO control signal that indicates the predetermined frequency; a microcontroller for processing a frequency measurement value with a reference value to provide a digital VCO control signal that indicates the value of the analog VCO control signal required for causing the VCO to produce the VCO output signal at the predetermined frequency and for pulse-width-modulating the digital VCO control signal; and a low-pass filter for converting the pulse-width modulated VCO control signal into the analog VCO control signal. The frequency synthesizer includes a plurality of VCOs which provide VCO output signals at a plurality of predetermined frequencies in response to respectively separate PWM VCO control signals provided by a microcontroller that processes measurement values for the respective VCOs with reference values for the respective VCOs. Coarse and fine components of the digital VCO control signal are pulse-width modulated and converted to provide high-resolution analog VCO control signals.

12 Claims, 1 Drawing Sheet

FREQUENCY SYNTHESIZER UTILIZING PULSE-WIDTH MODULATION OF DIGITAL VCO CONTROL SIGNAL

BACKGROUND OF THE INVENTION

The present invention generally pertains to electronic communications systems and is particularly directed to an improvement to frequency synthesizers of the type that include a voltage controlled oscillator (VCO).

In frequency synthesizers of the type that include a VCO, the VCO produces a VCO output signal at a predetermined frequency in response to an analog VCO control signal. In one of the VCO type of frequency synthesizer, the analog VCO control signal is generated by a phase-locked loop circuit in which an input signal is phase locked to a reference signal at the predetermined frequency. In another of the VCO type of frequency synthesizer, the analog VCO control signal is generated by a charge pump circuit which supplements or decreases the voltage of the analog VCO control signal in response to an error signal produced by comparing a reference value that is representative of the predetermined frequency with a measurement value representative of the measured frequency of the VCO output signal. The measurement value typically is produced by scaling the measured frequency of the VCO output signal to a proportionately lower frequency.

SUMMARY OF THE INVENTION

The frequency synthesizer of the present invention provides a steady and accurate analog VCO control signal by processing a measurement value with a reference value to provide a digital VCO control signal that indicates the value of an analog VCO control signal required for causing the VCO to produce the VCO output signal at a predetermined frequency, pulse-width modulating the digital VCO control signal, and converting the PWM VCO control signal into the analog VCO control signal.

The frequency synthesizer of the present invention includes a voltage-controlled oscillator (VCO) for producing a VCO output signal within a given frequency range, wherein the VCO produces the VCO output signal at a predetermined frequency in response to an analog VCO control signal that indicates the predetermined frequency; means for providing a reference value representative of the predetermined frequency; means for measuring the frequency of the VCO output signal to provide a measurement signal having a value representative of the measured frequency and for processing the measurement value with the reference value to provide a digital VCO control signal that indicates the value of the analog VCO control signal required for causing the VCO to produce the VCO output signal at the predetermined frequency; means for providing a pulse-width-modulated (PWM) VCO control signal representative of the digital VCO control signal; and means for converting the PWM VCO control signal into the analog VCO control signal; wherein the converting means are coupled to the VCO for controlling the VCO in response to the analog VCO control signal.

The value of the digital VCO control signal represents the absolute value of the analog VCO control signal rather than a relative value that represents an increase or decrease of the analog VCO control signal such as represented by the error signal produced by a charge pump circuit. The advantage of providing an absolute value is that the digital values can be directly associated with predetermined frequencies. Thus, tuning the VCO to a new frequency can be as simple as changing the value of the digital VCO control signal.

To provide sufficiently high resolution in the frequency synthesizer of the present invention, the digital VCO control signal provided by the processing means includes a coarse component and a fine component; the means for providing the PWM VCO control signal includes means for providing a coarse-component PWM VCO control signal in response to the coarse component of the digital VCO control signal; and means for providing a fine-component PWM VCO control signal in response to the fine component of the digital VCO control signal; and the converting means includes means for converting the coarse-component PWM VCO control signal into a coarse-component of the analog VCO control signal; means for converting the fine-component PWM VCO control signal into a fine-component of the analog VCO control signal; and means for combining the coarse and fine components of the analog VCO control signal to provide the analog VCO control signal used for controlling the VCO.

In the preferred embodiment of the frequency synthesizer of the present invention, the processing means, the means for providing the coarse-component PWM VCO control signal and the means for providing the fine-component PWM VCO control signal are embodied in a microcontroller.

VCO characteristics are not linear and a given change in the analog VCO control voltage does not produce the same amount of change in the frequency of the VCO output signal in all portions of the given frequency range. The use of a microcontroller to determine the value of the digital VCO control signal makes it possible to implement a piece-wise linearization of the VCO frequency-control voltage characteristic and then determine the value of the digital VCO control signal for quickly and accurately tuning the VCO without substantial over or under damping of the analog VCO control voltage.

In one aspect of the invention, a frequency synthesizer according to the present invention as described above includes a plurality of VCOs which provide VCO output signals at a plurality of predetermined frequencies in response to respectively separate PWM VCO control signals provided by a single processing means that efficiently processes measurement values for the respective VCOs with reference values for the respective VCOs.

Additional features of the present invention are discussed in relation to the description of the preferred embodiment.

DESCRIPTION OF THE PREFERRED EMBODIMENT

Figure 1:
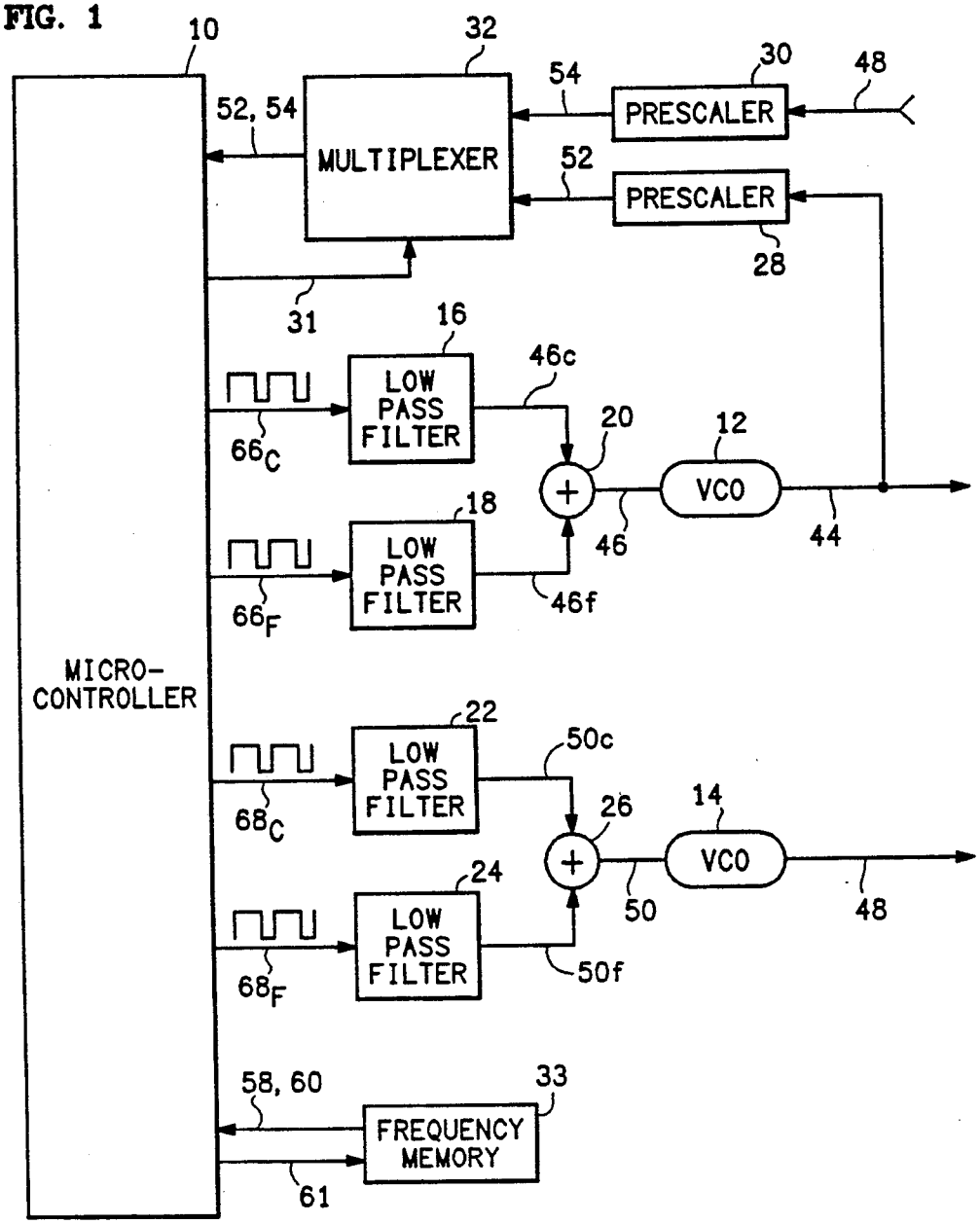
FIG. 1 is a block diagram of a preferred embodiment of a frequency synthesizer according to the present invention.

Referring to FIG. 1, a preferred embodiment of the frequency synthesizer of the present invention includes a microcontroller 10, a first VCO 12, a second VCO 14, a first low-pass filter 16, a second low-pass filter 18, a first summation circuit 20, a third low-pass filter 22, a fourth low-pass filter 24, a second summation circuit 26, a first scaler 28, a second scaler 30, a time-division multiplexer 32 and a frequency memory 33. Operation of the multiplexer 32 is controlled by a control signal on line 33 from the microcontroller 10.

Figure 2:
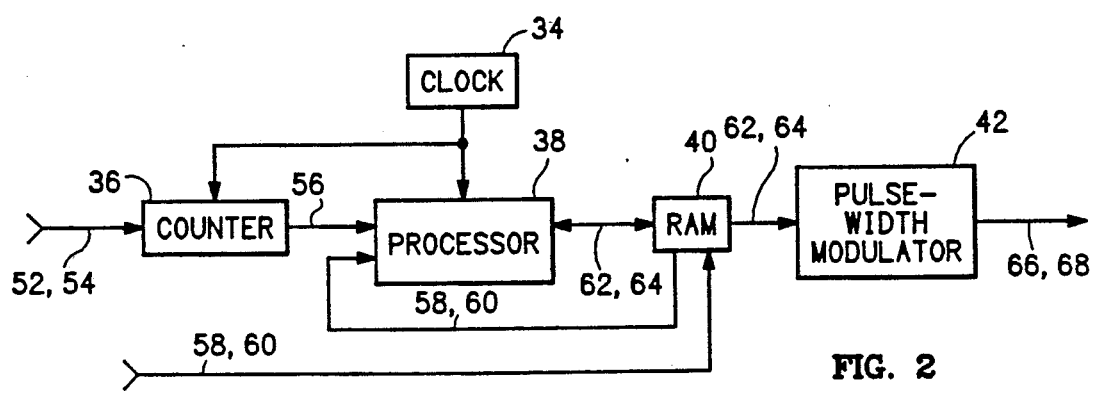
FIG. 2 is block diagram of some of the functional means embodied in the microcontroller of the frequency synthesizer of FIG. 1.

Referring to FIG. 2, the microcontroller 10 embodies a clock 34, a counter 36, a processor 38, a random-access memory (RAM) 40 and a pulse-width modulator 42. The clock 34 clocks the operations of the functional components of the microcontroller 10, including the counting by the counter 36 and the processing by the processor 38.

The first VCO 12 produces a first VCO output signal 44 within a first given frequency range. The first VCO 12 produces the first VCO output signal 44 at a first predetermined frequency in response to a first analog VCO control signal 46 that indicates the first predetermined frequency.

The second VCO 14 produces a second VCO output signal 48 within a second given frequency range. The second VCO 14 produces the second VCO output signal 48 at a second predetermined frequency in response to a second analog VCO control signal 50 that indicates the second predetermined frequency.

The first prescaler 28 scales the frequency of the first VCO output signal 44 to provide a scaled first VCO output signal 52 having a proportionately lower frequency that is more suitable for measurement by the microcontroller 10.

The second prescaler 30 scales the frequency of the second VCO output signal 48 to provide a scaled second VCO output signal 54 having a proportionately lower frequency that is more suitable for measurement by the microcontroller 10.

The microcontroller 10 alternately processes the time-division-multiplexed scaled first and second VCO output signals 52, 54 to internally provide first and second measurement values respectively representative of the measured frequency of the first VCO output signal 44 and the second VCO output signal 48. The counter 36 counts the number of cycles of the scaled VCO output signal within a given duration determined by the clock 34, and the processor 36 processes the count 56 for the scaled VCO output signal 52, 54 to determine the frequency of the respective VCO output signal 44, 48.

First and second reference values 58, 60 that are respectively representative of the first and second predetermined frequencies are provided to the microcontroller 10 by the frequency memory 33 in response to a frequency-selection address signal 61 from the microcontroller 10 and stored in the RAM 40.

The processor 38 retrieves the first and second reference values 58, 60 separately from the RAM 40 for processing with the respective first and second measurement values. The processor 38 processes the first measurement value with the first reference value 58 to provide a first digital VCO control signal 62 that indicates the value of the first analog VCO control signal 46 required for causing the first VCO 12 to produce the first VCO output signal 44 at the first predetermined frequency. The processor 38 processes the second measurement value with the second reference value 60 to produce a second digital VCO control signal 64 that indicates the value of the second analog VCO control signal 50 required for causing the second VCO 14 to produce the second VCO output signal 48 at the second predetermined frequency. The values of the first and second digital VCO control signals 62, 64 are stored in the RAM 40. The processor produces the digital VCO control signals 62, 64 by comparing the respective measurement values with the reference values 58, 60 and adjusting the values of the digital VCO control signals 62, 64 previously stored in the RAM 40 for the respective VCO 12, 14 by any difference between the respective measurement value and reference value 58, 60 indicated by such comparison. The values of the adjusted digital VCO control signals 62, 64 are then stored in the RAM 40.

The pulse-width modulator 42 pulse-width modulates the digital VCO control signal for each of the VCOs 12, 14 to provide a first pulse-width-modulated (PWM) VCO control signal 66 representative of the first digital VCO control signal 62 and a second PWM VCO control signal 68 representative of the second digital VCO control signal 64. The width of the pulses are indicated by the values of the respective digital VCO control signal 62, 64.

Each of the first and second digital VCO control signals 62, 64 provided by the processor 38 includes a coarse component and a fine component.

The pulse-width modulator 42 provides a first coarse-component PWM VCO control signal $66_C$ in response to the coarse component of the first digital VCO control signal 62, a second coarse-component PWM VCO control signal $68_C$ in response to the coarse component of the second digital VCO control signal 64, a first fine-component PWM VCO control signal $66_F$ in response to the fine component of the first digital VCO control signal 62 and a second fine-component PWM VCO control signal $68_F$ in response to the fine component of the second digital VCO control signal 64.

The first and second coarse and fine-component PWM VCO control signals $66_C$, $66_F$, $68_C$, $68_F$ are respectively provided to separate output ports of the microcontroller 10.

The first low-pass filter 16 converts the first coarse-component PWM VCO control signal $66_C$ into a coarse-component $46_C$ of the first analog VCO control signal 46.

The second low-pass filter 18 converts the first fine-component PWM VCO control singnal $66_F$ into a fine component $46_F$ of the first analog VCO control signal 46.

The first summation circuit 20 combines the coarse and fine components $46_C$, $46_F$ of the first analog VCO control signal to provide the first analog VCO control signal 46 used for controlling the first VCO 12.

The third low-pass filter 22 converts the second coarse-component PWM VCO control signal $68_C$ into a coarse-component $50_C$ of the second analog VCO control signal 50.

The fourth low-pass filter 24 converts the second fine-component PWM VCO control signal $68_F$ into a fine-component $50_F$ of the second analog VCO control signal 50.

The second summation circuit 26 combines the coarse and fine components $50_C$, $50_F$ of the second analog VCO control signal to provide the second analog VCO control signal 50 used for controlling the second VCO 14.

The filter characteristics can be adjusted to accommodate various response time/filtering characteristics. Typically, increasing the number of poles can reduce the response time by speeding up the tuning and increasing rejection of frequency components of the PWM VCO control signal component being filtered.

The frequency synthesizer of the present invention is particularly useful in a up/down converter, such as used in a satellite communication system for tuning the VCOs of a plurality of frequency synthesizers simultaneously.

We claim:

1. A frequency synthesizer, comprising
a voltage-controlled oscillator (VCO) for producing a VCO output signal within a given frequency range, wherein the VCO produces the VCO output signal at a predetermined frequency in response to an analog VCO control signal that indicates the predetermined frequency;
means for providing a reference signal having a value representative of the predetermined frequency;
means for measuring the frequency of the VCO output signal to provide a measurement signal having a value representative of the measured frequency and for processing the measurement signal with the reference signal to provide a digital VCO control signal that indicates the value of the analog VCO control signal required for causing the VCO to produce the VCO output signal at the predetermined frequency;
means for providing a pulse-width-modulated (PWM) VCO control signal representative of the digital VCO control signal; and
means for converting the PWM VCO control signal into the analog VCO control signal;
wherein the converting means are coupled to the VCO for controlling the VCO in response to the analog VCO control signal.

2. A frequency synthesizer according to claim 1, wherein the digital VCO control signal provided by said means for measuring and processing includes a coarse component and a fine component;
wherein said PWM VCO control signal includes
a coarse-component in response to the coarse component of said digital VCO control signal; and
a fine-component in response to the fine component of said digital VCO control signal; and
wherein the converting means includes
means for converting the coarse-component PWM VCO control signal into a coarse-component of the analog VCO control signal;
means for converting the fine-component PWM VCO control signal into a fine-component of the analog VCO control signal; and
means for combining the coarse and fine components of the analog VCO control signal to provide the analog VCO control signal used for controlling the VCO.

3. A frequency synthesizer according to claim 2, wherein, the means for providing the PWM VCO control signal is embodied in a microcontroller.

4. A frequency synthesizer according to claim 3, wherein the microcontroller further includes clock means for clocking said means for measuring and processing; and
wherein said means for measuring and processing is coupled to the clock means for defining a given duration and includes means for scaling the frequency of the VCO output signal to provide a scaled VCO output signal having a proportionately lower frequency, and means for counting the number of cycles of the scaled VCO output signal within said given duration to determine the frequency of the VCO output signal.

5. A frequency synthesizer according to claim 1, wherein said means for measuring and processing includes clock means for clocking; and
wherein said means for measuring and processing is coupled to the clock means for defining a given duration and includes means for scaling the frequency of the VCO output signal to provide a scaled VCO output signal having a proportionately lower frequency, and means for counting the number of cycles of the scaled VCO output signal within said given duration and to determine the frequency of the VCO output signal.

6. A frequency synthesizer according to claim 5, wherein said clock means, the counting means and the are embodied in the microcontroller.

7. A frequency synthesizer, comprising
a first voltage-controlled oscillator (VCO) for producing a first VCO output signal within a first given frequency range, wherein the first VCO produces the first VCO output signal at a first predetermined frequency in response to a first analog VCO control signal that indicates the first predetermined frequency.
a second VCO for producing a second VCO output signal within a second given frequency range, wherein the second VCO produces the second VCO output signal at a second predetermined frequency in response to a second analog VCO control signal that indicates the second predetermined frequency;
means for providing a first reference signal having a value representative of the first predetermined frequency and a second reference signal having a value representative of the second predetermined frequency;
means for measuring the frequency of the first VCO output signal to provide a first measurement signal having a value representative of the measured frequency of the first VCO output signal, for measuring the frequency of the second VCO output signal to provide a second measurement signal having a value representative of the measured frequency of the second VCO output signal, and for processing the first and second measurement signals with the first and second reference signals respectively to provide a first digital VCO control signal that indicates the value of the first analog VCO control signal required for causing the first VCO to produce the first VCO output signal at the first predetermined frequency and a second digital VCO control signal that includes the value of the second analog VCO control signal required for causing the second VCO to produce the second VCO output signal at the second predetermined frequency:
means for providing a first pulse-width-modulated (PWM) VCO control signal representative of the first digital VCO control signal and a second PWM VCO control signal representative of the second digital VCO control signal; and
first converting means for converting the first PWM VCO control signal into the first analog VCO control signal, wherein the first converting means are coupled to the first VCO for controlling the first VCO in response to the first analog VCO control signal; and second converting means for converting the second PWM VCO control signal into the second analog VCO control signal, wherein the second converting means are coupled to the second VCO for controlling the second VCO in response to the second analog VCO control signal.

8. A frequency synthesizer according to claim 7, wherein the first and second digital VCO control signals provided by said means for measuring and processing each includes a coarse component and a fine component;

wherein the said PWM VCO control signals include
a first coarse-component in response to said coarse component of the first digital VCO control signal; a second coarse-component in response to the coarse component of said second digital VCO control signal;
a first fine-component in response to the fine component of said first digital VCO control signal and a second fine-component PWM VCO control signal in response to the fine component of the second digital VCO control signal; and wherein the converting means includes
means for converting the first coarse-component PWM VCO control signal into a coarse-component of the first analog VCO control signal;
means for converting the first fine-component PWM VCO control signal into a fine-component of the first analog VCO control signal;
means for combining the coarse and fine components of the first analog VCO control signal to provide the first analog VCO control signal used for controlling the first VCO.
means for converting the second coarse-component PWM VCO control signal into a coarse-component of the second analog VCO control signal;
means for converting the second fine-component PWM VCO control signal into a fine-component of the second analog VCO control signal; and
means for combining the coarse and fine components of the second analog VCO control signal to provide the second analog VCO control signal used for controlling the second VCO.

9. A frequency synthesizer according to claim 7, wherein, the means for providing the PWM VCO control signals is embodied in a microcontroller.

10. A frequency synthesizer according to claim 9, wherein the microcontroller includes clock means for clocking said means for measuring and processing and
wherein said means for measuring and processing is coupled to the clock means for defining a given duration and include a first means for scaling the frequency of the first VCO output signal to provide a scaled first VCO output signal having a proportionately lower frequency and a second $d_1$ means for counting the number of cycles of the scaled first VCO output signal and a second VCO output signal within the given duration for the to determine the frequency of the first VCO output signal, and the second VCO output signal.

11. A frequency synthesizer according to claim 6, wherein said means for measuring and processing includes clock means for clocking; and
wherein said means for measuring and processing is coupled to the clock means for defining a given duration and include a first means for scaling the frequency of the first VCO output signal to provide a scaled first VCO output signal having a proportionately lower frequency and a second $d_1$ means for counting the number of cycles of the scaled first VCO output signal and a second VCO output signal within the said given duration, for the to determine the frequency of the first VCO output signal, and the second VCO output signal.

12. A frequency synthesizer according to claim 11, wherein said clock means the counting means, and the are embodied in the microcontroller.

* * * * *

UNITED STATES PATENT AND TRADEMARK OFFICE
CERTIFICATE OF CORRECTION

PATENT NO. : 5,216,374
DATED : June 1, 1993
INVENTOR(S) : Ashok K. George and Branislav Petrovic It is certified that error appears in the above-identified patent and that said Letters Patent is hereby corrected as shown below:

Column 4, line 46, change "singnal" to --signal--.
Column 6, line 54, change "includes" to --indicates--.

Column 8, line 19, change "d" to --means for scaling the frequency of the second VCO output signal to provide a scaled second VCO output signal having a proportionately lower frequency,--.

Column 8, line 21, change "a" to --the scaled--.
Column 8, line 22, delete "for the"

Column 8, line 33, change "d" to --means for scaling the frequency of the second VCO output signal to provide a scaled second VCO output signal having a proportionately lower frequency,--.
Column 8, line 35, change "a" to -- the scaled--.
Column 8, line 36, delete "said" and "for the".
Column 8, line 40, after "means", insert --and--; and delete "and the".

Signed and Sealed this

Seventeenth Day of May, 1994

Attest:

BRUCE LEHMAN

*Attesting Officer*  *Commissioner of Patents and Trademarks*